United States Patent [19]
Wei

[11] Patent Number: 5,208,719
[45] Date of Patent: May 4, 1993

[54] OUTPUT PAD ELECTROSTATIC DISCHARGE PROTECTION CIRCUIT FOR MOS DEVICES

[75] Inventor: Yi-Hen Wei, Saratoga, Calif.

[73] Assignee: VLSI Technology, Inc., San Jose, Calif.

[21] Appl. No.: 747,545

[22] Filed: Aug. 20, 1991

[51] Int. Cl.$^5$ .............................................. H02H 9/04
[52] U.S. Cl. ..................................... 361/56; 361/91; 361/111; 307/550; 257/358; 257/355
[58] Field of Search .............................. 361/56, 91, 111; 357/23.13, 42; 307/550

[56] References Cited

U.S. PATENT DOCUMENTS

| | | | |
|---|---|---|---|
| 4,066,918 | 1/1978 | Heuner et al. | 361/91 |
| 4,678,950 | 7/1987 | Mitake | 307/550 |
| 4,855,620 | 8/1989 | Davvury et al. | 361/91 |
| 5,021,853 | 6/1991 | Mistry | 357/23.13 |

Primary Examiner—Todd E. DeBoer
Attorney, Agent, or Firm—Flehr, Hohbach, Test, Albritton & Herbert

[57] ABSTRACT

A circuit protects the series coupled PMOS-NMOS transistor output stage, input stage or input/output stage commonly found in a CMOS device from output pad ESD, whether or not the CMOS device is mounted in a circuit board or coupled to a power source. The circuit includes a second PMOS transistor whose output leads are coupled between the output pad and the gate of the output NMOS transistor, and also includes a resistor coupled between the gate of this second PMOS transistor and a voltage source node. A positive potential ESD at the output pad will turn on the second PMOS transistor, thereby coupling positive ESD potential to the gate of the output NMOS transistor. This causes the output NMOS transistor to turn on, avoiding the "snapback" mode destruction that would occur if the second PMOS transistor were not present. The resistor cooperates with the intrinsic capacitance present at the gate of the second PMOS transistor to form an RC filter that prevents noise transients coupled to this gate from turning on the second PMOS transistor. A second preferred embodiment is a protective circuit that includes the above described series coupled output PMOS, NMOS transistors, the second PMOS transistor, and the resistor. This embodiment provides output pad ESD protection to other circuits (drivers, for example) coupled to the input gate of the output transistors, or circuits (input buffers, for example), coupled to the output pad.

19 Claims, 2 Drawing Sheets

OUTPUT PAD ELECTROSTATIC DISCHARGE PROTECTION CIRCUIT FOR MOS DEVICES

FIELD OF THE INVENTION

This invention relates generally to MOS semiconductor devices, and more particularly to output pad protection circuits for protecting such devices from electrostatic discharge voltages.

BACKGROUND OF THE INVENTION

CMOS device typically have an output stage that includes a PMOS transistor and NMOS transistor coupled in series between two power sources. The transistor drains are coupled together to an output pad and, depending upon the device configuration, the transistor gates are either coupled to an output of another CMOS device (e.g., a driver) or to a power source. Typical device configurations include inverters, and various buffers.

Because of their thin oxides and high impedances, CMOS devices are very susceptible to damage from electrostatic discharge ("EDS"), especially before they are mounted in a circuit board. Electrostatic potentials are easily generated. For example, a person can accumulate static charge simply by walking across a room, or by wearing nylon. If the person then handles a CMOS device, the accumulated charge can discharge through the device, causing ESD damage.

After being mounted in a circuit board, CMOS devices are somewhat protected from ESD damage by the circuit board layout, and various protective devices provided at the board input/output connections. However before such mounting, CMOS devices are "bare" and are especially vulnerable to ESD damage. While bare, the output NMOS and PMOS transistors are off because no power source is coupled to the CMOS device.

It is known in the art how to protect the input pad of a bare CMOS device from ESD using diodes, resistors or transistors. However it is not known how to protect a bare CMOS device from ESD at the output pad. Design constraints do not permit coupling a protective resistor or diode in series with the output pad to provide output pad ESD protection. Although negative potential ESD at the output pad will not harm the CMOS device, a positive potential ESD can destroy the device's output NMOS transistor. Fortunately, the output PMOS transistor needs no output pad ESD protection because it is a buried channel device, and is therefore relatively "robust".

A positive potential ESD at the output pad causes the turned-off NMOS transistor to enter a "snapback" mode. In this mode, drain current increases uncontrollably and is dissipated across a small, localized channel area. The resulting current density in this area quickly becomes excessive, and localized breakdown occurs, destroying the NMOS transistor.

It is therefore an object of the present invention to protect the output NMOS transistor of a CMOS device from a positive ESD voltage at the output pad, without significantly degrading device performance, and without significantly increasing manufacturing cost. Further, the ESD protection should be effective even when the CMOS device is unconnected to other devices.

SUMMARY OF THE INVENTION

The present invention protects a CMOS device from output pad ESD by turning the output NMOS transistor on when positive ESD is present. As a result, the output NMOS transistor safely dissipates ESD current and does not enter the destructive "snapback" mode. The present invention protects the CMOS device even when it is not connected to a power supply or other devices.

In particular, a protective circuit according to the present invention includes a second PMOS transistor whose output leads are coupled between the output pad and the gate of the output NMOS transistor. The gate of this second PMOS transistor is coupled to the source lead of the output PMOS transistor, preferably through a resistor. (Alternatively, the second PMOS transistor gate may be coupled to any node in the circuit that is to be coupled to the circuit's highest voltage source). This resistor cooperates with the intrinsic capacitance present at the gate of the second PMOS transistor to form an RC (i.e., resistor-capacitor) low pass filter. This filter prevents noise transients from turning on the second PMOS transistor during normal circuit operation, but allows this transistor to be turned on by positive ESD.

Positive ESD voltage at the output pad turns on the second PMOS transistor, causing it to couple together the drain and gate of the output NMOS transistor. As a result, the positive ESD at the output pad is coupled to the gate of the output NMOS transistor, turning it on. Because it is now turned on, the output NMOS transistor safely dissipates ESD drain current across the entire channel structure, avoiding localized breakdown and "snapback" mode destruction.

In the absence of a positive ESD voltage, the second PMOS transistor remains off, allowing the output NMOS transistor (and the CMOS device) to function normally when coupled to a power source. In the presence of a negative ESD voltage, the junction between the N+ drain region of the NMOS transistor and the substrate turns on, and the output NMOS transistor is not harmed. Thus the output NMOS transistor is protected against positive ESD potential, is not harmed by negative ESD potential, and remains off when there is no ESD at the output pad.

The second PMOS transistor comprises a circuit that, by itself, protects the output NMOS transistor from ESD. On the other hand, this second PMOS transistor together with the output PMOS and NMOS transistors collectively form a larger ESD protective circuit. This larger circuit will protect CMOS devices coupled to the gates of the output PMOS, NMOS transistors, or coupled to the output pad, from output pad ESD. Further, such ESD protection is provided whether the CMOS device is unconnected, or is coupled to a power source.

Other features and advantages of the invention will appear from the following description in which the preferred embodiments have been set forth in detail in conjunction with the accompanying drawings.

DETAILED DESCRIPTION OF THE PREFERRED EMBODIMENT

Figure 1:
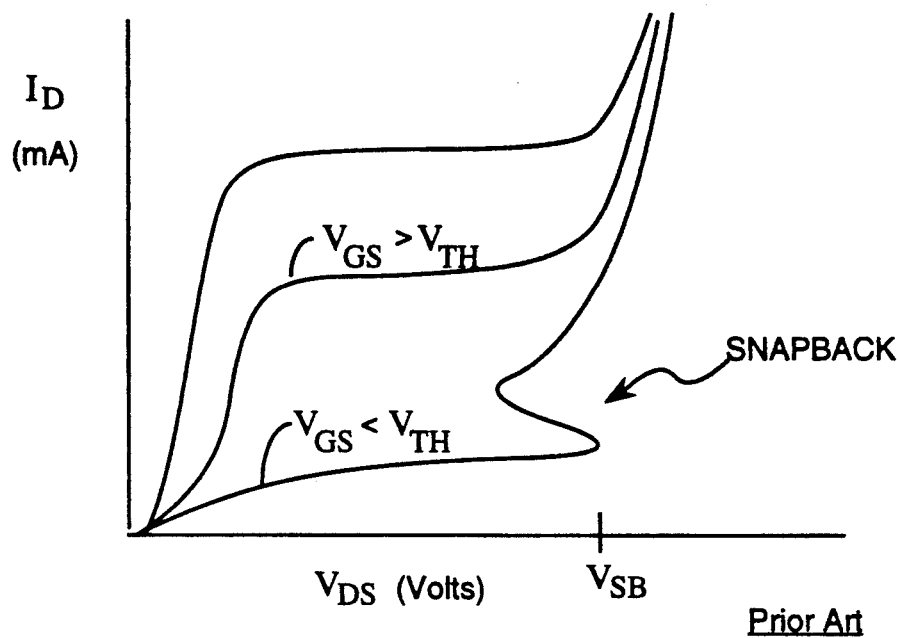
FIG. 1 illustrates the characteristics of a typical enhancement mode NMOS transistor as a function of drain-gate voltage ($V_{DS}$) and gate-source voltage ($V_{GS}$)

FIG. 1 illustrates the characteristics of a typical enhancement mode NMOS transistor as a function of the drain-gate voltage ($V_{DS}$) and the gate-source voltage ($V_{GS}$). When $V_{GS}$ exceeds the threshold voltage ($V_{TH}$), the NMOS transistor is on, and the drain current $I_D$ is dissipated safely over the entire channel width. For example, silicon can handle a current density of about 10 mA/$\mu$m, and thus an NMOS transistor having a 100 $\mu$m wide channel can safely dissipate about 1 A.

However when $V_{GS} < V_{TH}$, increasing $V_{DS}$ beyond $V_{SB}$ causes the NMOS transistor to enter the destructive snapback mode. In this mode, $V_{DS}$ decreases and $I_D$ rapidly increases, and unfortunately the drain current dissipates over a relatively small portion of the channel (say about 20%). Furthermore, an output transistor is normally implemented with multiple parallel channel, sometimes called fingers. Normally, one finger will snapback before the other fingers. The $V_{DS}$ drop caused by the "snapback finger" prevents the other fingers from turning on, causing all the drain current to be dumped into just one finger instead of the whole transistor. As a result, the maximum permissible current density in this localized channel area is greatly exceeded, and the NMOS transistor is destroyed.

The magnitude of $V_{SB}$ is somewhat process dependent, being about 14 V for a 0.8 $\mu$m–1.0 $\mu$m process, and about 10 V–12 V for a 0.5 $\mu$m process. Unfortunately, the ESD at the output pad of a CMOS device can easily exceed these magnitudes. FIG. 1 suggests that the destructive snapback mode can be avoided by turning the NMOS transistor on, and by avoiding a drain-gate electric field in excess of about 10 V to 14 V (depending upon the process). This relatively low $V_{SB}$ threshold voltage helps explain why the NMOS transistor receives no snapback protection from a reverse biased diode coupled from its drain to substrate. Such a diode typically breaks down at about 18 F-20 V, too high a threshold to provide protection since snapback mode destruction occurs at about 10 V–14 V. Further, FIG. 1 shows that once snapback mode commences, the drain-gate voltage across the NMOS transistor actually decreases, making it more difficult for a diode to breakdown and protect the NMOS transistor.

Figure 2:
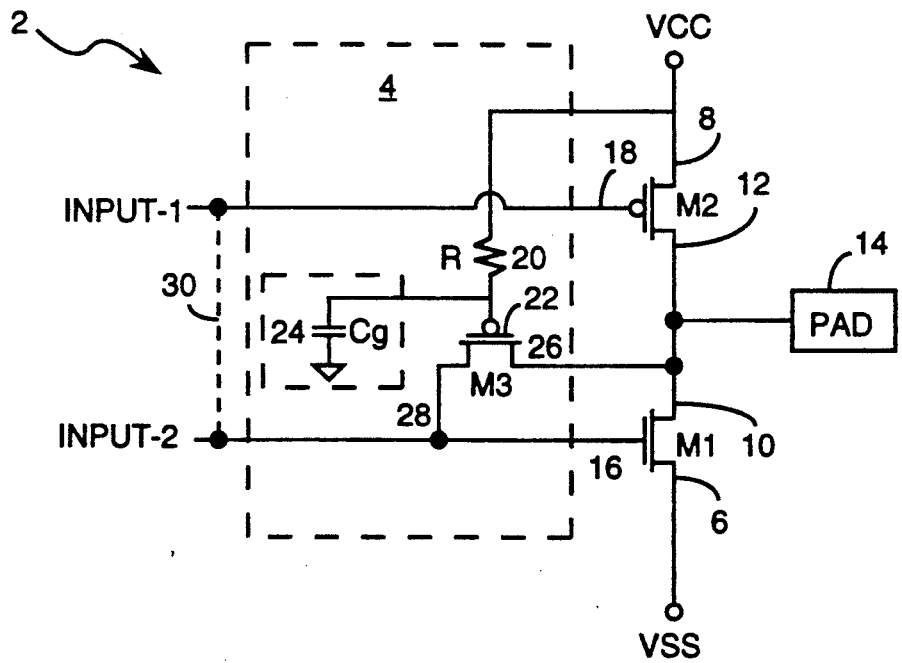
FIG. 2 is a schematic of a generalized CMOS device output stage, provided with ESD protection according to the present invention.

FIG. 2 shows a generalized CMOS device output stage 2 provided with an ESD protection circuit 4 according to the present invention. The output stage 2 comprises an output NMOS transistor M1 and an output PMOS transistor M2 coupled in series between first and second power source leads $V_{cc}$, $V_{ss}$. The source 6 of M1 is coupled to the $V_{ss}$ lead, the source 8 of M2 is coupled to the $V_{cc}$ lead, and the drains 10, 12 of M1, M2 are together coupled to an output pad 14. M1 has a gate 16 adapted to receive a first input voltage, and M2 has a gate 18 adapted to receive a second input voltage. When mounted in a circuit board, the device $V_{cc}$, $V_{ss}$ leads typically represent upper and lower voltage source nodes, that are respectively coupled to upper and lower power source buses.

The protection circuit 4 includes a second PMOS transistor M3 and a resistor 20. M3 includes a gate 22 that is coupled to one end of resistor 20, the other resistor end being coupled to the $V_{cc}$ lead of M2. An intrinsic capacitance Cg (shown as capacitor 24) is present at gate 22, and includes all the capacitance "seen" at the gate, including the gate-source and body capacitance of M3. M3 has a source 26 coupled to the output pad 14, and a drain 28 coupled to the gate 16 of M1.

The present invention functions whether leads $V_{cc}$, $V_{ss}$ are floating (e.g., the CMOS output stage is "bare"), or are coupled to upper and lower power sources, commonly denoted $V_{cc}$, $V_{ss}$. When so coupled, power source $V_{cc}$ typically is positive relative to $V_{ss}$, with $V_{cc}$ being set at +5 V, while $V_{ss}$ is set to 0 V (also called ground). M1, M2, M3 are enhancement mode devices preferably having $V_{TH}$ between approximately 0.5 V and 1.0 V, and may be fabricated with interchangeable sources and drains (e.g., either output lead may be designated as the source or the drain lead). In the preferred embodiment resistor 20 is about 20 $\Omega$ to about 10,000 $\Omega$, and gate capacitance 24 is about 0.005 pf to about 0.1 pf. The resistor 20 is preferably fabricated as polysilicon resistor, a polycide resistor, a P+ diffusion resistor, or an N+ diffusion resistor. In the preferred embodiment, M1 has a lightly doped drain, and M1, M2 and M3 are silicided polysilicon gate transistors. However the present invention may be practiced with transistors whether or not they are lightly doped, or silicided on both the gate and source/drain.

Before an integrated circuit incorporating the output stage 2 shown in FIG. 2 is inserted into a circuit board, all of the circuit leads 16, 18, $V_{cc}$, $V_{ss}$, 14 are floating, and M1, M2 and M3 are off. Consider now the effect of a positive ESD potential at the output pad 14 upon circuit 2.

A positive ESD potential at the pad 14 turns on M3 because it imposes a negative potential across its gate 22 and source 26. (Actually because the ESD magnitude can exceed several hundred volts, positive ESD will turn M3 on even if the $V_{cc}$ lead and the $V_{ss}$ lead are coupled to power sources.) When M3 turns on, positive ESD potential from the output pad 14 is coupled to M1's gate 16. This creates a positive potential from gate 16 to source 6, causing M1 to turn on. Once on, M1 conducts drain current in a normal manner, and does not enter the destructive snapback mode previously described.

FIG. 1 provides some insight into why the protective circuit 4 works. FIG. 1 indicates that snapback is avoided when $V_{GS} > V_{TH}$, e.g., when the NMOS transistor is turned on. Further, FIG. 1 suggests that snapback is avoided when $V_{DS} > V_{SB}$, e.g., when $V_{DS}$ is less than about 10 V to 14 V, depending upon the fabrication process. In FIG. 2, M3 prevents a large field from developing across M1's drain and gate (e.g., the "safe" condition $V_{DS} > V_{SB}$ is met for M1). Further, positive ESD turns M3 on, which causes M1 to turn on (e.g., the "safe" condition $V_{GS} > V_{TH}$ met for M1). By avoiding snapback on M1, due to M3's biasing of M1's gate 16, the present invention avoids any localized drain to source current path, or finger, and the ESD surge is uniformly dissipated through the entire M1 transistor. As a result, the maximum current density in the M1 transistor is significantly reduced compared with typical snapback conditions, and destruction of the transistor is avoided.

While the protective circuit 4 would work if M3's gate 22 were coupled directly to the $V_{cc}$ lead (e.g., resistor 20 = 0 Ω), it is advantageous to include a resistor 20 having a resistance of about 200 ω to about 10,000 Ω. Resistor 20 cooperates with the intrinsic capacitance 24 to form an RC (resistor-capacitor) low pass filter at M3's gate 22. This RC filter stabilizes M3 so it will not turn on if noise transients appear at the $V_{cc}$ lead. Such transients could occur, for example, from a noisy $V_{cc}$ power source coupled to the $V_{cc}$ lead. To be effective, this RC time constant at gate 22 is preferably greater (e.g., slower) than the effective RC time constant present at the output pad 14 as seen by an ESD signal. This time constant relationship allows M3 to be turned on by ESD at pad 14, but not by transient nose on the $V_{cc}$ lead. Since the RC time constant at the output pad 14 is typically on the order of nanoseconds, a resistor 20 of at least 200 Ω is usually sufficient, depending on the gate capacitance Cg 24.

The output stage 4 in FIG. 2 may be configured as a CMOS inverter device simply by coupling together gates 16 and 18 (as shown in phantom by coupling line 32). In this configuration, the inverter input is coupled to either input 1 or input 2, and the inverter output appears at pad 14. As described above, M3 will protect the inverter output NMOS transistor M1 against output pad ESD. When positive ESD is present at pad 14, an inverter so constructed will discharge the ESD current safely through M1. Thus, any other circuitry (not shown) coupled to receive an input signal from pad 14 receives ESD protection from the inverter.

Figure 3A:
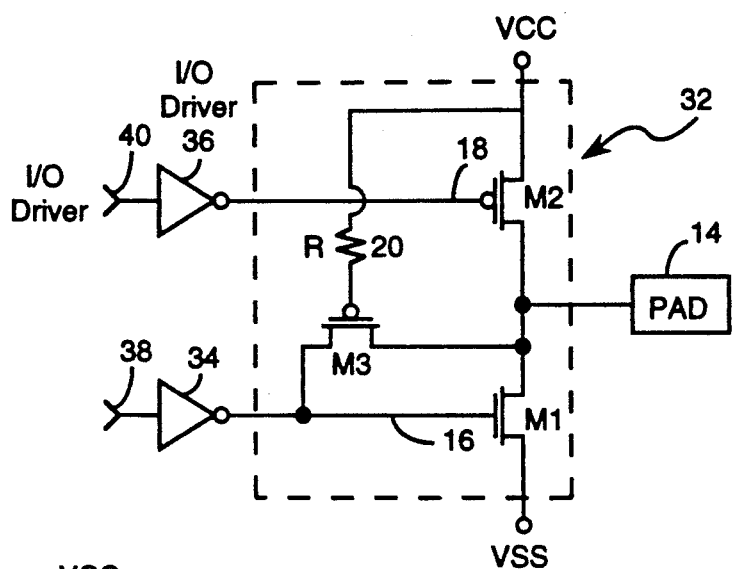
FIG. 3A is a schematic of a CMOS output buffer device, provided with ESD protection according to the present invention.
Figure 3B:
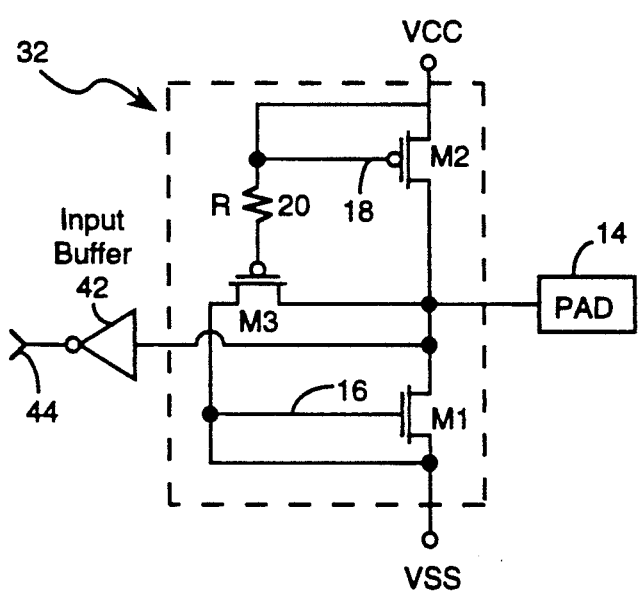
FIG. 3B is a schematic of a CMOS input buffer device provided with ESD protection according to the present invention.
Figure 3C:
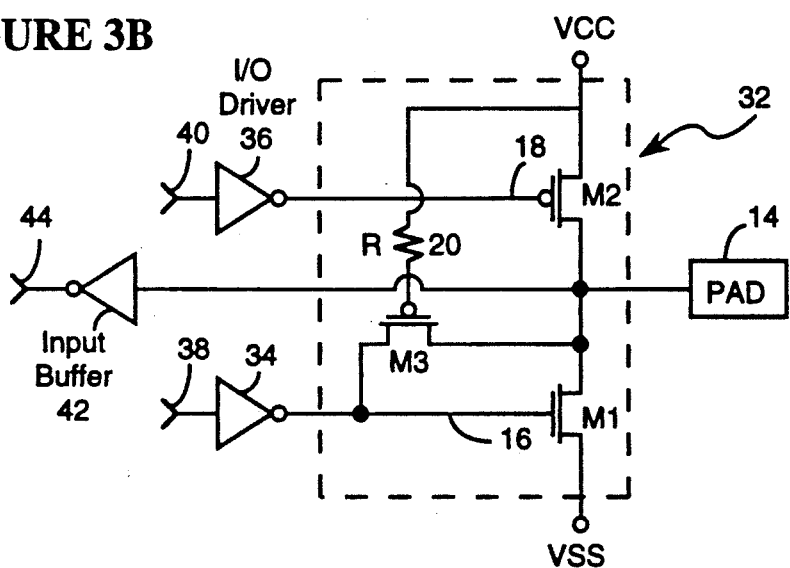
FIG. 3C is a schematic of a CMOS input/output buffer device, provided with ESD protection according to the present invention.

FIGS. 3A-3C show configurations whereby a protective circuit 32 according to the present invention provides ESD output pad protection to various buffers. The protective circuit 32 comprises M1, M2, M3 and resistor 20, which are coupled and operate as described above.

In FIG. 3A, first and second drivers 34, 36 are respectively coupled to gates 16, 18 of M1, M2. Buffer input signals are coupled to buffer input leads 38, 40 and the buffer output signal appears at the pad 14. In the absence of ESD at pad 14, M3 remains off, but in the presence of positive potential ESD, M1 turns on, safely discharging the ESD. Not only does the circuit 32 protect the drivers 34, 36 from output pad ESD, but other circuitry (not shown) coupled to receive an input signal from pad 14 will also be provided ESD protection.

In FIG. 3B, a buffer 42 is coupled so as to receive its input signal from the pad 14, and to provide a buffered output signal at lead 44. As described above, the circuit 32 will protect buffer 42 against positive ESD at the pad 14.

FIG. 3C represents an input/output buffer configuration protected by the circuit 32. FIG. 3C in essence is a composite of FIG. 3A and FIG. 3B. The circuit 32 protects drivers 34, 36 and buffer 42 against ESD at the pad 14, as described above.

While the present invention has been described with reference to specific embodiments, the description is illustrative of the invention and is not to be construed as limiting the invention. Various modifications may occur to those skilled in the art without departing from the true spirit and scope of the invention as defined by the appended claims.

What is claimed is:

1. In a CMOS device that includes an output PMOS transistor coupled in series with an output NMOS transistor, the PMOS and NMOS transistors each including first and second output leads and a gate, the first output leads being coupled to an output pad, an output protection circuit comprising:
   a second PMOS transistor, including a gate coupled to a voltage source node in the circuit, a first output lead coupled to the output pad, and a second output lead coupled to the gate of the output NMOS transistor;
   whereby a positive ESD potential at said output pad turns on said second PMOS transistor, thereby turning on the output NMOS transistor;
   said output NMOS transistor being protected thereby from snapback mode destruction that would occur in the absence of the output protection circuit.

2. The output protection circuit of claim 1, further including a resistor coupled in series between said gate of said second PMOS transistor and said voltage source node in the circuit.

3. The output protection circuit of claim 2, wherein said second output lead of said output PMOS transistor is said voltage source node.

4. The output protection circuit of claim 2, wherein said resistor has a resistance between 200 Ω and 10,000 Ω.

5. The output protection circuit of claim 2, wherein said resistor is a resistive circuit element chosen from the group consisting of a polysilicon resistor, a polycide resistor, a P + diffusion resistor, and an N + diffusion resistor.

6. The output protection circuit of claim 2, wherein said resistor forms an RC low pass filter in conjunction with intrinsic capacitance present at said gate of said second PMOS transistor;
   said low pass filter preventing said second PMOS transistor from being turned on by transients coupled through said resistor.

7. The output protection circuit of claim 1, wherein said gate of the output PMOS transistor and said gate of the output NMOS transistor are coupled together to form an inverter.

8. The output protection circuit of claim 1, wherein a power source is coupled to a chosen one of the second output lead of the output PMOS transistor, and the second output lead of the output NMOS transistor.

9. In a CMOS input buffer device that includes an input lead coupled to an input pad, an input protection circuit comprising:
   an output PMOS transistor coupled in series with an output NMOS transistor, said PMOS and NMOS transistors each including a gate, a first output lead coupled to the input pad, and a second output lead;
   said gate and second output lead of said output PMOS transistor being coupled together to a first voltage source node; said gate and second output lead of said output NMOS transistor being coupled together to a second voltage source node; and
   a second PMOS transistor, including a gate coupled to said first voltage source node, a first output lead coupled to the input pad, and a second output lead coupled to said gate of said output NMOS device;
   whereby a positive ESD potential at said input pad turns on said second PMOS transistor, thereby turning on said output NMOS transistor;
   the input buffer device being protected thereby from damage from said positive ESD potential at said input pad that would occur int he absence of said input protection circuit.

10. The input protection circuit of claim 9, further including a resistor coupled in series between said gate of said second PMOS transistor and said first voltage source node.

11. The input protection of claim 10, wherein said resistor has a resistance between 200 Ω and 10,000 Ω.

12. The input protection circuit of claim 10, wherein said resistor is a resistive circuit element chosen from the group consisting of a polysilicon resistor, a polycide resistor, a P + diffusion resistor, and an N + diffusion resistor.

13. The input protection circuit of claim 10, wherein said resistor forms an RC low pass filter in conjunction with intrinsic capacitance present at said gate of said second PMOS transistor;

said low pass filter preventing said second PMOS transistor from being turned on by transients coupled through said resistor.

14. In a CMOS output buffer device having first and second input/output drivers, each driver having an input lead and an output lead, an output protection circuit comprising:

an output pad;

an output PMOS transistor coupled in series with an output NMOS transistor, said PMOS and NMOS transistors each including a first output lead coupled to said output pad, said PMOS transistor further including a second output lead, and a gate, said gate coupled to the output lead of the first input/output driver; said NMOS transistor further including a second output lead and a gate, said gate coupled to the output lead of the second input/output driver; and a second PMOS transistor, including a gate coupled to a voltage source node in the circuit, a first output lead coupled to said output pad, and a second output lead coupled to said gate of said output NMOS device;

whereby a positive ESD potential at said output pad turns on said second PMOS transistor, thereby turning on said output NMOS transistor;

the output buffer device being protected thereby from damage from said positive ESD potential at said output pad that would occur in the absence of said output pad protection circuit.

15. The output protection circuit of claim 14, further including a resistor coupled in series between said gate of said second PMOS transistor and said voltage source node.

16. The output protection circuit of claim 15, wherein said resistor has a resistance between 200 Ω and 10,000 Ω.

17. The output protection circuit of claim 15, wherein said resistor is a resistive circuit element chosen from the group consisting of a polysilicon resistor, a polycide resistor, a P + diffusion resistor, and an N + diffusion resistor.

18. The output protection circuit of claim 15, wherein said resistor forms an RC low pass filter in conjunction with intrinsic capacitance present at said gate of said second PMOS transistor;

said low pass filter preventing said second PMOS transistor from being turned on by transients coupled through said resistor.

19. The output protection circuit of claim 15, wherein the CMOS output buffer device further includes an input buffer having an input lead coupled to said output pad, and an output lead;

whereby the output protection circuit also protects the input buffer from a positive ESD potential at said output pad.

* * * * *